United States Patent
Nilsson

(10) Patent No.: US 8,779,863 B2
(45) Date of Patent: Jul. 15, 2014

(54) GENERATING AN OSCILLATOR SIGNAL HAVING A DESIRED FREQUENCY IN A CONTINUOUS FREQUENCY RANGE

(75) Inventor: Magnus Nilsson, Lund (SE)

(73) Assignee: Ericsson Modems SA, LE Grand-Saconnex (CH)

( * ) Notice: Subject to any disclaimer, the term of this patent is extended or adjusted under 35 U.S.C. 154(b) by 115 days.

(21) Appl. No.: 13/508,414

(22) PCT Filed: Nov. 19, 2010

(86) PCT No.: PCT/EP2010/067832
§ 371 (c)(1),
(2), (4) Date: May 7, 2012

(87) PCT Pub. No.: WO2011/061293
PCT Pub. Date: May 26, 2011

(65) Prior Publication Data
US 2012/0223751 A1    Sep. 6, 2012

Related U.S. Application Data

(60) Provisional application No. 61/263,425, filed on Nov. 23, 2009.

(30) Foreign Application Priority Data

Nov. 19, 2009    (EP) ..................................... 09176449

(51) Int. Cl.
*H03L 7/06*    (2006.01)
(52) U.S. Cl.
USPC ............................................. 331/74; 327/156
(58) Field of Classification Search
USPC ........................................... 331/74; 327/156
See application file for complete search history.

(56) References Cited

U.S. PATENT DOCUMENTS

| | | | |
|---|---|---|---|
| 7,439,812 B1 | 10/2008 | Lombaard et al. | |
| 2010/0189194 A1* | 7/2010 | Dawkins et al. | 375/316 |
| 2011/0199135 A1* | 8/2011 | Fukuda | 327/156 |

FOREIGN PATENT DOCUMENTS

EP    1 770 854 A2    4/2007

OTHER PUBLICATIONS

International Search Report issued in corresponding International application No. PCT/EP2010/067832, mailed Jan. 20, 2011.
O'Sullivan, Eugene et al., "Ultra-Fast Locking, Low Jitter, Auto-Ranging Phase-Locked Loop", NORCHIP Conference, 2006, 24th IEEE, PI, Nov. 1, 2006, pp. 251-255, XP031057895, ISBN: 978-1-4244-0772-9.

(Continued)

*Primary Examiner* — Joseph Chang
(74) *Attorney, Agent, or Firm* — Patent Portfolio Builders PLLC

(57) ABSTRACT

A method of generating a first oscillator signal having a desired frequency in a first frequency range comprises generating in a voltage controlled oscillator unit a second oscillator signal having a frequency in a second frequency range of at least one octave. The method further comprises selecting said second continuous frequency range to have a lower endpoint in said first frequency range and an upper endpoint above said range; and selectively using the oscillator signal unchanged or dividing it by a division ratio selected from integer powers of the number 2 to obtain said first oscillator signal. By centering the VCO higher than otherwise required and using an additional divider, so that the VCO signal can selectively be used unchanged or divided, a sufficient margin below as well as above the desired range for e.g. drift and tolerances of the VCO is achieved. It also simplifies the VCO design.

6 Claims, 7 Drawing Sheets

(56) References Cited

OTHER PUBLICATIONS

Hara, Shoichi et al., "A 6.3MHz to 5.7GHz Tunable LC-Based VCO Using a Divide-by-N Injection-Locked Frequency Divider", Asian Solid-State Circuits Conference, 2009, IEEE, Taipei, Taiwan, Nov. 16-18, 2009, pp. 81-84, XP031582932, ISBN: 978-1-4244-4435-5.
R. Dutta, et al., "A Low Power Architecture to Extend the Tuning Range of a Quadrature Clock", 2009 22nd International Conference on VLSI Design, Jan. 5-9, 2009, pp. 439-444, IEEE.
J. Kim, et al., "A Programmable 25 MHz to 6 GHz Rational-K/L Frequency Synthesizer with Digital Kvco Compensation", Circuits and Systems, 2008. ISCAS 2008. IEEE International Symposium, May 18-21, 2008, pp. 2629-2632, IEEE.
M. R. Saadat, et al., "Simulation and Improvement of Two Digital Adaptive Frequency Calibration Techniques for Fast Locking Wide-Band Frequency Synthesizers", Design & Technology of Integrated Systems in Nanoscale Era, 2007, DTIS. International Conference, Sep. 2-5, 2007, pp. 136-141, IEEE.

* cited by examiner

GENERATING AN OSCILLATOR SIGNAL HAVING A DESIRED FREQUENCY IN A CONTINUOUS FREQUENCY RANGE

TECHNICAL FIELD

The invention relates to wireless communication systems and especially multiband transceivers where a wide range of frequencies have to be supported. The invention also relates to a method of generating an oscillator signal having a desired frequency in a continuous frequency range.

BACKGROUND

Frequency spectrum is a scarce resource in modern communications systems, and therefore e.g. the Third-Generation Partnership Project (3GPP) specification group is continuously adding new frequency bands.

Most modern transceiver solution use direct conversion receiver and transmitter architectures to reduce complexity and minimize power consumption. Such transceivers use local oscillators for frequency generation in the receiver part as well as the transmitter part. The receiver and the transmitter need quadrature local oscillator signals. These are normally generated by dividing the local oscillator signal by two. Thus the local oscillator signal should preferably be operating at twice (or a higher even multiple) the desired receive/transmit frequency.

The output from the local oscillators has to be a clean low noise signal to get good quality reception/transmission. This is normally done by locking a voltage controlled LC-oscillator to a crystal oscillator using a phase locked loop. The LC-oscillator needs to cover all desired receive and transmit radio frequencies, i.e. a wide range of frequencies has to be supported.

A typical LC-oscillator consists of an inductor, a variable capacitor, a resistor representing all losses and a sustaining amplifier. The inductor can be implemented as a large on chip metal structure and the capacitor is made variable to be able to generate various output frequencies. The capacitor can consist of switchable capacitors, variable capacitors or a combination thereof.

It has proven to be difficult to generate high capacitor variations. When the available range is in-sufficient one has to use multiple VCO:s centered differently and select the correct one via a multiplexer. This generates bulky solutions, and one might need to add a new VCO for each new frequency band to be supported.

By adding a frequency divider at the VCO output to divide the VCO output by two the need for frequency variations of the VCO can be reduced. In principle, it would then be sufficient that the VCO covers a frequency range corresponding to one octave, i.e. with a factor two between the upper and lower endpoints of the VCO frequency range.

However, in practice the VCO center frequency will vary across Process, supply Voltage and Temperature (PVT). Thus if the center frequency has drifted downwards or upwards from its nominal value the complete desired frequency range can not necessarily be covered with a relative VCO range of two. Therefore, the variations of the center frequency impose a need for extra margins at each end of the tuning range. Also to avoid respins of an ASIC, some margin should be added for centering error in the design. Altogether this forces the designer to have ~12% margins at each end of the tuning range, and the required tuning range for continuous tuning range becomes 2.5 instead of the factor 2 mentioned above. This value is still difficult to achieve with one VCO, and therefore multiple VCOs will still have to be used. Typically, it will take three VCOs to cover a tuning range of 2.5.

It might be possible to reduce the number of VCOs by doing a more clever VCO design. For instance, the inductor could also be made switchable. However it will always be difficult to reach a relative tuning range of 2.5.

Among the main problems with existing solutions are cost and efficiency. Multiple VCOs occupy a lot of space and the multiplexing will consume current. By designing wide tuning range VCOs the number of VCOs required could be reduced. However, when designing wide tuning range VCOs more switching is required, which introduces resonator loss. This means worse noise performance and higher current consumption. Thus there clearly is a need to reduce the tuning range requirements of the VCO.

SUMMARY

Therefore, it is an object of embodiments of the invention to provide a simple way of reducing the required VCO tuning range.

According to embodiments of the invention the object is achieved in a method of generating a first oscillator signal having a desired frequency in a first continuous frequency range, the method comprising generating in a voltage controlled oscillator unit with at least one voltage controlled oscillator a second oscillator signal having a frequency in a combined second continuous frequency range of at least one octave. The method further comprises the steps of selecting said second continuous frequency range to have a lower endpoint in said first frequency range and an upper endpoint above said first frequency range; and selectively using said second oscillator signal unchanged or dividing said second oscillator signal by a division ratio selected from a group of division ratios comprising integer powers of the number 2 to obtain said first oscillator signal.

By centering the VCO higher than otherwise required, i.e. such that the VCO covers the upper part of the desired frequency range and some frequencies above this range, and using an additional divider, so that the VCO signal can selectively be used unchanged to cover the upper part of the desired frequency range or divided to cover the lower parts of the desired frequency range, a sufficient margin below as well as above the desired range for e.g. drift and tolerances of the VCO is achieved. It also simplifies the VCO design, which saves area, current and increases the probability of first-time-right silicon.

The method further comprises the steps of comparing the actual frequency of said first oscillator signal with said desired frequency; and selecting said division ratio in dependence of the result of the comparison. In this way the optimal division ratio can easily be found.

The object is achieved in that the step of selecting said division ratio comprises tuning the voltage controlled oscillator unit to a frequency at an endpoint of said second continuous frequency range; selecting an initial division ratio from said group of division ratios so that the frequency of said first oscillator signal is within said first frequency range; and adjusting, if possible, the frequency of the voltage controlled oscillator unit so that the frequency of said first oscillator signal equals said desired frequency, and otherwise changing the division ratio and adjusting the frequency of the voltage controlled oscillator unit so that the frequency of said first oscillator signal equals said desired frequency. Using an endpoint of the VCO frequency range further simplifies the process of adjusting the generated frequency to the desired value.

In one embodiment the second continuous frequency range is selected so that its upper endpoint is √2 times the upper endpoint of the first frequency range. In this way similar margins are obtained below as well as above the desired range for e.g. drift and tolerances of the VCO.

The group of division ratios may comprise the ratios 2 and 4. This allows a desired relative frequency range of four with sufficient margins from a VCO covering one octave.

As mentioned, some embodiments of the invention also relate to a voltage controlled oscillator arrangement for generating a first oscillator signal having a desired frequency in a first continuous frequency range, the arrangement comprising a voltage controlled oscillator unit with at least one voltage controlled oscillator, the unit being configured to generate a second oscillator signal having a frequency in a combined second continuous frequency range of at least one octave. The second continuous frequency range has been selected to have a lower endpoint in said first frequency range and an upper endpoint above said first frequency range; and the arrangement further comprises means for selectively using said second oscillator signal unchanged or dividing said second oscillator signal by a division ratio selected from a group of division ratios comprising integer powers of the number 2 to obtain said first oscillator signal.

Embodiments corresponding to those mentioned above for the method also apply for the arrangement.

BRIEF DESCRIPTION OF THE DRAWINGS

Embodiments of the invention will now be described more fully below with reference to the drawings, in which.

DETAILED DESCRIPTION OF EMBODIMENTS

Figure 1:
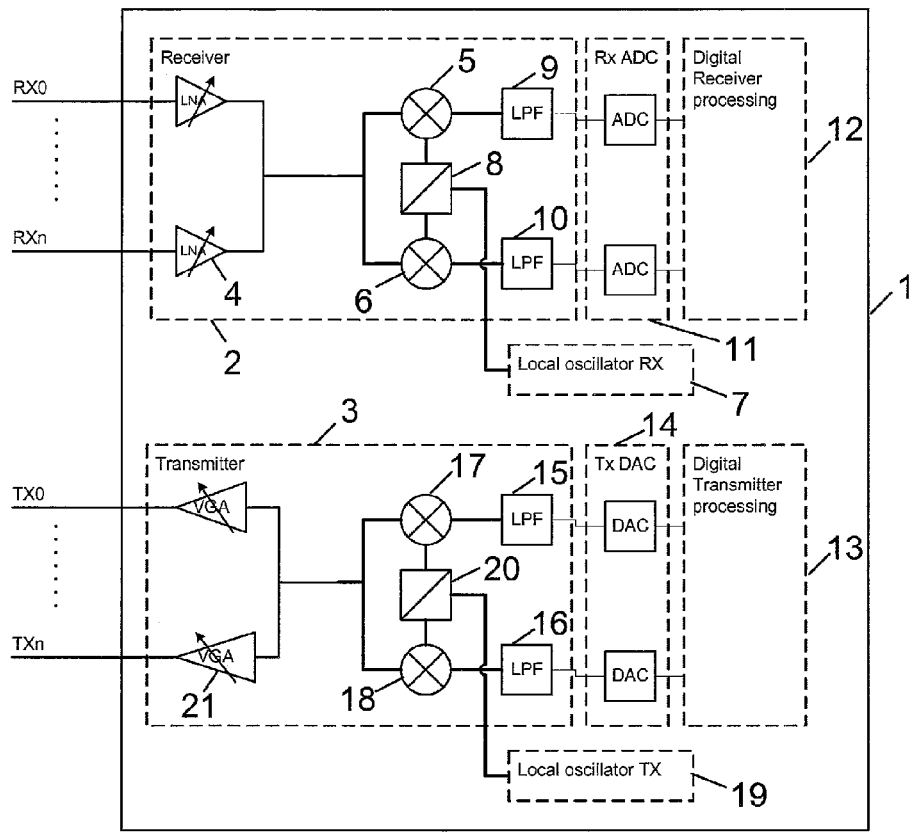
FIG. 1 shows a block diagram of an RF transceiver in which the invention can be used.

FIG. 1 shows a block diagram of a typical RF transceiver 1 in which the invention can be used. The transceiver 1 has a receiver part 2 and a transmitter part 3. Most modern transceiver solutions use direct conversion receiver and transmitter architectures to reduce complexity and minimize power consumption. The receiver and the transmitter need quadrature local oscillator signals.

Thus in the receiver 2 the received signals are fed from low noise amplifiers 4 to mixers 5, 6 in which the received information is translated to baseband frequency by mixing the received signals with quadrature local oscillator signals. These are normally generated by dividing a local oscillator signal from a local oscillator 7 responsible for frequency generation by a factor 2 or a higher even multiple in the divider 8. Thus the local oscillator signal should preferably be operating at twice (or a higher even multiple) the desired RX frequency. The two outputs from the mixers 5, 6 are an in-phase component and a quadrature component, and they are low pass filtered in the filters 9 and 10 before they are converted to digital values in the analog-to-digital converter unit 11 and further processed in the baseband processing stages 12.

Similarly, in the transmitter part signals from the processing stages 13 are converted in the digital-to-analog converter unit 14 and filtered in filtered in filters 15, 16 before they are mixed to radio frequencies in the mixers 17, 18 and fed to amplifiers 21. Again, the quadrature local oscillator signals are generated by dividing a local oscillator signal from a local oscillator 19 responsible for frequency generation by a factor 2 or a higher even multiple in a divider 20.

The output from local oscillators 7 and 19 has to be a clean low noise signal to get good quality reception/transmission. This is normally done by locking a voltage controlled LC-oscillator to a crystal oscillator using a phase locked loop. The LC-oscillator needs to cover all desired receive and transmit radio frequencies, i.e. a wide range of frequencies has to be supported.

Figure 2:
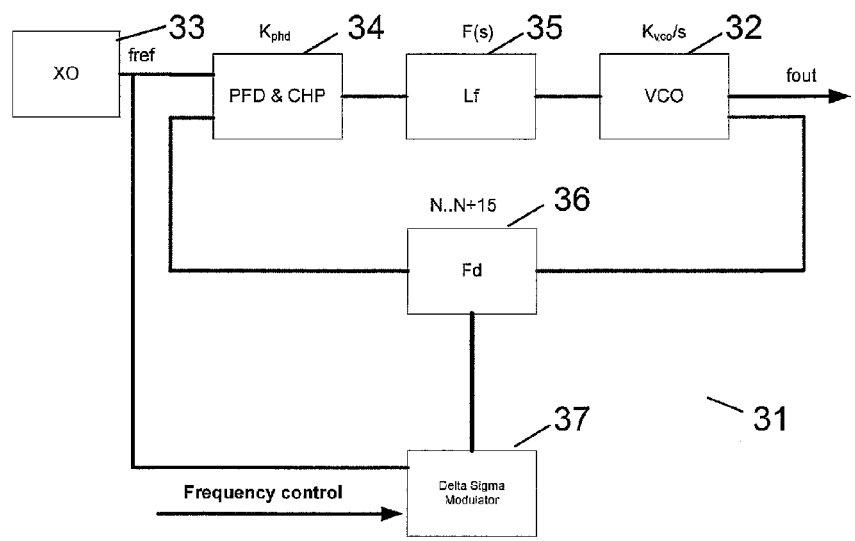
FIG. 2 shows a block diagram of a phase locked loop with a voltage controlled oscillator.

A block diagram of a typical phase locked loop 31 is depicted in FIG. 2, where the LC-oscillator 32 is locked to the crystal oscillator 33. In a phase frequency detector and charge pump 34 the phase of the feedback signal is compared to the phase of the reference signal from the crystal oscillator 33. If the phase of the feedback signal is behind that of the reference signal a short UP signal is generated, which in the charge pump is converted to a positive current pulse into a capacitor of the loop filter 35. Likewise, if the phase of the feedback signal is ahead that of the reference signal a short DOWN signal is generated, which in the charge pump is converted to a negative current pulse drawn from the loop filter 35. In a dead band, where the phases of the reference and feedback signals are equal or close to each other, the detector will fire either both or neither of the charge pumps with no effect on the loop filter 35. The voltage of the loop filter 35 in turn controls the frequency of the voltage controlled LC-oscillator 32. The feedback path of the fractional-N phase locked loop comprises a frequency divider 36 and a delta sigma modulator 37 to ensure that the generated output frequency from the voltage controlled LC-oscillator 32 is divided appropriately to be compared with the reference signal in the phase frequency detector.

Figure 3:
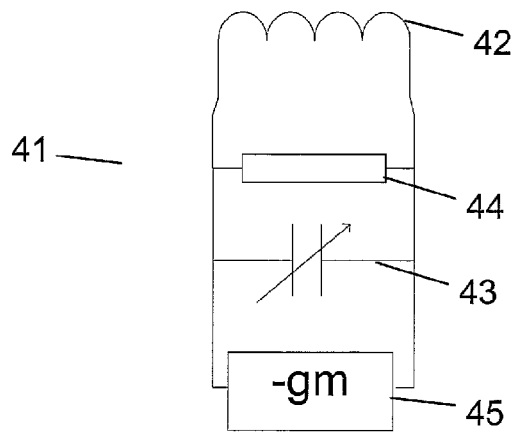
FIG. 3 shows a block diagram of a voltage controlled LC oscillator.

An example block diagram of a typical voltage controlled LC-oscillator 41 is shown in FIG. 3. The upper part is the resonator, consisting of an inductor 42, a variable capacitor 43, a resistor 44 representing all losses and a sustaining amplifier 45. The inductor 42 can be implemented as a large on chip metal structure and the capacitor 43 can be made variable to be able to generate various output frequencies. The capacitor 43 can consist of switchable capacitors, variable capacitors or a combination there-of.

As mentioned, the oscillator needs to cover a wide range of frequencies. The different frequencies in this range are obtained by varying the capacitor 43 correspondingly. The resonant condition for the oscillator is given by $$f = \frac{1}{2\pi\sqrt{LC}},$$

where C is the total capacitance available in the resonator.

One realizes here that to be able to generate all possible frequencies in a frequency range from $f_{min}$ to $f_{max}$, the C has to be varied by a factor $f_{max}^2/f_{min}^2$. The capacitance is lower limited by the self resonance frequency of the inductor, VCO loading and other parasitics. Further, it has proven to be difficult to generate high capacitor variations. Thus the obtainable frequency variation of one VCO is limited.

If the range of one VCO is insufficient to cover the needed frequency range, you have to use multiple VCO:s centered differently and then select the correct one via a multiplexer. This generates bulky solutions, and you might need to add a new VCO for each new frequency band to be supported. This solution is illustrated with the VCO unit 51 in FIG. 4 using three VCO:s 52, 53 and 54 in combination with a multiplexer 55.

Figure 4:
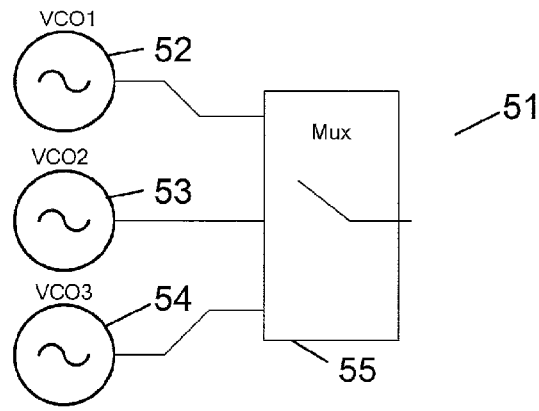
FIG. 4 shows a VCO unit using three VCOs in combination with a multiplexer.
Figure 5:
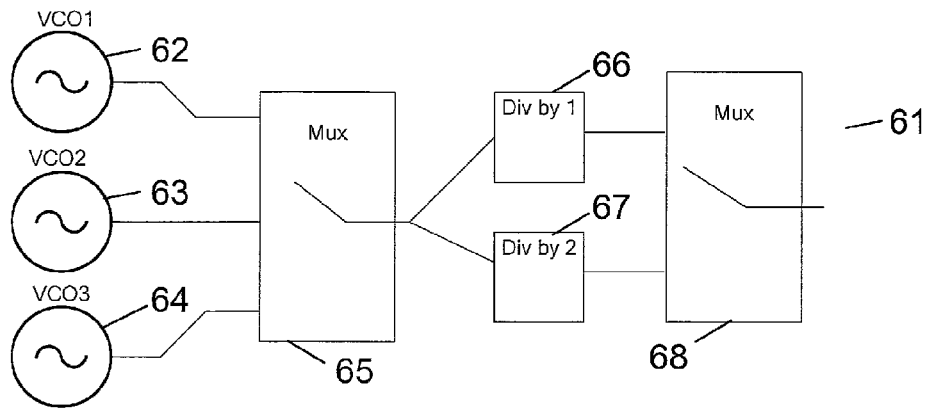
FIG. 5 shows a setup in which a divide-by-2 divider is used to extend the relative frequency range of a VCO unit.

A way to reduce the need for frequency variations of the VCO unit is to add a frequency divider at the VCO output to divide the VCO output by 2 to provide the lower frequencies in the range. If e.g. $f_{max}$ is four times $f_{min}$, i.e. the factor $f_{max}/f_{min}$ is four, and the output frequency can be divided by e.g. two, it will be sufficient that the VCO covers e.g. the frequency range from $f_{max}/2$ to $f_{max}$ corresponding to one octave. In other words, this will relax the VCO output range requirements to a factor two. A block diagram of such a setup 61 is shown in FIG. 5, where the VCOs 62, 63 and 64 and the multiplexer 65 correspond to FIG. 4. The output from the multiplexer 65 is connected to the two frequency division blocks 66 and 67. It is noted that "division by 1" corresponds to leaving the signal unchanged, so the division block 66 is only shown for the sake of completeness. Finally, one of the outputs from the division blocks 66 and 67 is selected by the multiplexer 68.

Figure 6:
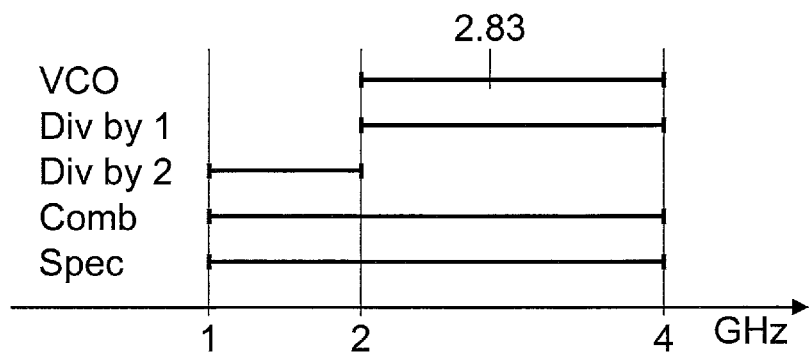
FIG. 6 illustrates an example of the frequency ranges of the setup of FIG. 5 with a VCO unit covering a relative range of 2 centered at 2.83 GHz.

In the example shown in FIG. 5, we aim for a continuous relative frequency range of four times. As an example, which is illustrated in FIG. 6, the desired output frequency range (spec) could be 1 to 4 GHz. The VCO:s should then cover a relative range of 2, i.e. 2 to 4 GHz, and the dividers make sure we double the range down to 1 GHz by combining the two ranges in the multiplexer 68. Thus the frequency range covered at the output of the multiplexer 68 (comb) corresponds to the desired range. The combined frequency range of the VCOs can thus be centered at the geometric mean of the lower and the higher VCO frequency, i.e. sqrt(2*4)=2.83 GHz. By adding more dividers we could extend the frequency coverage further downwards.

Figure 7:
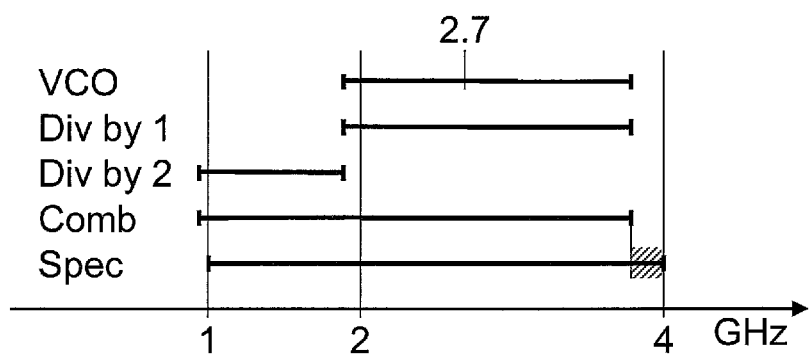
FIG. 7 illustrates the frequency ranges from FIG. 6 when the center frequency has drifted downwards.

However, in practice the VCO center frequency will vary across Process, supply Voltage and Temperature (PVT). Thus, as illustrated in FIG. 7, in which the center frequency has drifted downwards from the nominal value 2.83 GHz to 2.7 GHz, the complete desired frequency range can not necessarily be covered with a relative VCO range of two. Therefore, the variations of the center frequency impose a need for ~6% extra margins at each end of the tuning range. Also to avoid respins of an ASIC, some margin should be added for centering error in the design. This calls for yet another ~6% margins at each end of the range (In immature ASIC processes the modeling error could be very high, which could result in very high centering errors). Altogether this forces the designer to have ~12% margins at each end of the tuning range, and the required tuning range for continuous tuning range becomes $$\frac{2*1.12}{0.88} = 2.5.$$

This value is still difficult to achieve with one VCO, and therefore multiple VCO:s have to be used. Assuming we can design VCO:s with 1.5 (50%) tuning range, we will still require 3 VCO:s (e.g. the VCOs 62, 63 and 64 in FIG. 5) for continuous tuning range, since two VCO:s give a tuning range of $1.5^2=2.25$, which is still less than the required tuning range of 2.5, while three VCO:s give a sufficient tuning range of $1.5^3=3.375$.

Thus, as mentioned above, in practice the VCO:s would need to cover a tuning range of 2.5 to take the required margins into consideration. This means that since the actual centering frequency may vary from the nominal 2.83 GHz value due to the variations mentioned above, the nominal combined frequency range of the VCO:s should be 0.88*2 GHz-1.12*4 GHz, i.e. 1.76-4.48 GHz to ensure that the desired frequency range is actually covered. Similarly, if the desired combined frequency range of the VCOs of FIG. 4 is 2 to 4 GHz, the nominal combined frequency range of the VCO:s should be 1.76-4.48 GHz to ensure that the desired frequency range is actually covered.

One way to reduce the number of VCO:s could be to do a more clever VCO design. For instance, in FIG. 3, the inductor 42 could also be made switchable. However, it will always be difficult to reach a relative tuning range of 2.5.

Instead, a method to reduce the required VCO tuning range and still fulfilling the requirement of continuous tuning range across one octave is proposed.

The idea is to center the VCO higher than otherwise required and add a programmable divider that automatically divides the VCO output signal by 1 or 2 depending on the desired output frequency and the actual VCO centering (which could vary due to PVT spread and design mistakes/modeling errors).

Figure 8:
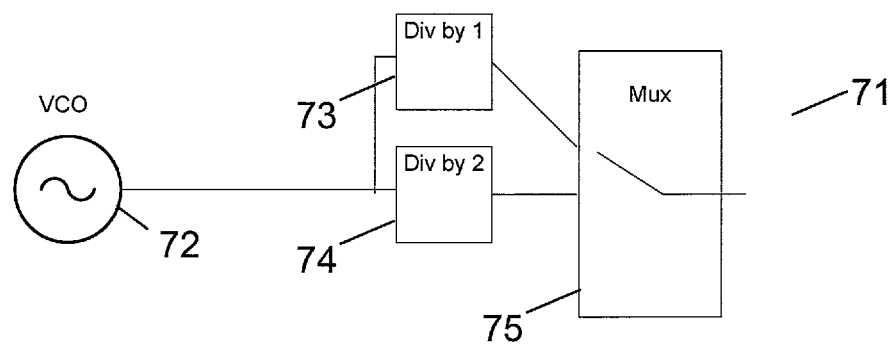
FIG. 8 shows a VCO arrangement in which the VCO output signal, which is centered higher than the desired frequency range, is selectively divided by 1 or 2.

A block diagram of this solution 71 is shown in FIG. 8. The VCO 72 in this figure can be a single VCO covering one octave, or it can represent e.g. the VCO unit of FIG. 4. If the desired frequency range is 2 to 4 GHz as in FIG. 4, this could be obtained by using a VCO with the same range, i.e. centered at 2.83 GHz, and dividing the output signal by 1, i.e. using the output signal unchanged. However, in this case there would be no margin if the VCO drifts downwards. It could also be obtained by using a VCO with a frequency range of 4 to 8 GHz, i.e. centered at 5.66 GHz, and dividing the output signal by 2, but in this case there would be no margin if the VCO drifts upwards.

However, the desired frequency range can also be obtained by combining the two possibilities, i.e. using a VCO with a frequency range centered anywhere between the two center values mentioned above and then dividing the output signal by 2 in the divider 74 to obtain the lower values in the desired range and dividing the output signal by 1, i.e. using the output signal unchanged, in the divider 74 to obtain the higher values in the desired range, which will allow margins for VCO drift. A multiplexer 75 then selects the appropriate one of the two divider) signals. Since the solution can handle VCO output signals in the range from 2 to 8 GHz, a good solution is obtained if the VCO is centered on the geometric mean of these 2 frequencies, i.e. sqrt(2*8)=4 GHz.

With this centering there will be large margins allowing drift of the actual VCO frequency upwards as well as downwards, and thus the VCO needs no longer cover the ~12% margins at each end of the tuning range mentioned above. However, a small margin will still be required to cover temperature drift and reduced tuning range due to process spread. Experiments have shown that we can assume 2.5% in each end. The new VCO tuning range is now $$\frac{2*1.025}{0.9575} = 2.1,$$

which is a significant reduction compared to the previous required tuning range of 2.5.

Figure 9:
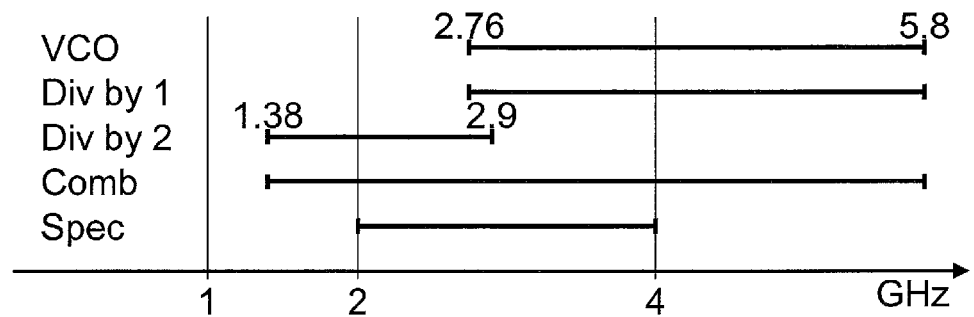
FIG. 9 illustrates an example of the frequency ranges for the arrangement of FIG. 8.

Adding the 2.5% margin at each end, the VCO should have a nominal frequency range of 0.975*4/sqrt(2) to 1.025*4*sqrt(2), i.e. 2.76 to 5.8 GHz. This is illustrated in FIG. 9, where it is seen that the divide-by-1 signal, which equals the VCO signal, nominally covers the frequency range from 2.76 to 5.8 GHz, while the divide-by-2 signal then covers the frequency range from 1.38 to 2.9 GHz, so that the combined covered frequency range is 1.38 to 5.8 GHz.

Thus with this centering, we can allow a huge VCO spread (−28%→+38%) and still produce the correct output frequencies in the desired frequency range from 2 to 4 GHz (Spec) by choosing the correct divider. If the desired output frequency is within the actual frequency range of the VCO unit, we should divide by 1, i.e. use the VCO frequency unchanged, and if the desired output frequency is below the actual frequency range of the VCO unit, we should use division ratio 2.

Figure 10:
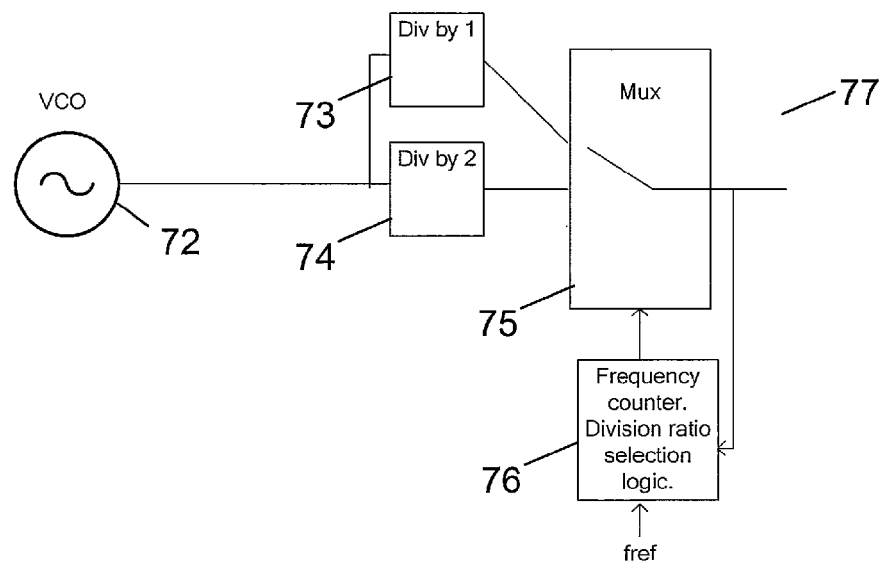
FIG. 10 shows the arrangement of FIG. 8 with a frequency counter added.

The choice of VCO division ratio should be made prior to locking the phase locked loop. It should be made every time the phase locked loop is locked to take changing operating conditions into account. There are several ways to do this selection. One way would be to use a frequency counter. The reference frequency for this counter would be the reference frequency of the phase locked loop. To get a frequency accuracy of 0.1%, we need to count 500 pulses. Assuming we count at ~500 MHz (VCO/4), this would take 1 us. This time is very small compared to the normal PLL locking time, which is ~100 us. FIG. 10 depicts a VCO system 77 with a frequency counter 76. The rest of the system corresponds to that of FIG. 8.

A divider choice algorithm could then look like this:
1. Tune the VCO to the highest frequency (corresponding to the nominal highest frequency 5.8 GHz in FIG. 9; the actual frequency may deviate slightly from this value due to drift and tolerances).
2. Select initial division ratio to be 2 (resulting in a nominal frequency of 2.9 GHz).
3. Estimate the frequency using the frequency counter.
4. If the estimated frequency is higher than the desired one, continue normal PLL locking. Otherwise, change the division ratio to be 1 and continue normal PLL locking.

Instead of tuning the VCO to its highest frequency, i.e. the upper endpoint of its frequency range, it could also be tuned to its lowest frequency, i.e. the lower endpoint of its frequency range. In that case the algorithm could look like this:
1. Tune the VCO to the lowest frequency (corresponding to the nominal lowest frequency 2.76 GHz in FIG. 9; the actual frequency may deviate slightly from this value due to drift and tolerances).
2. Select initial division ratio to be 1.
3. Estimate the frequency using the frequency counter.
4. If the estimated frequency is lower than the desired one, continue normal PLL locking. Otherwise, change the division ratio to be 2 and continue normal PLL locking.

Figure 11:
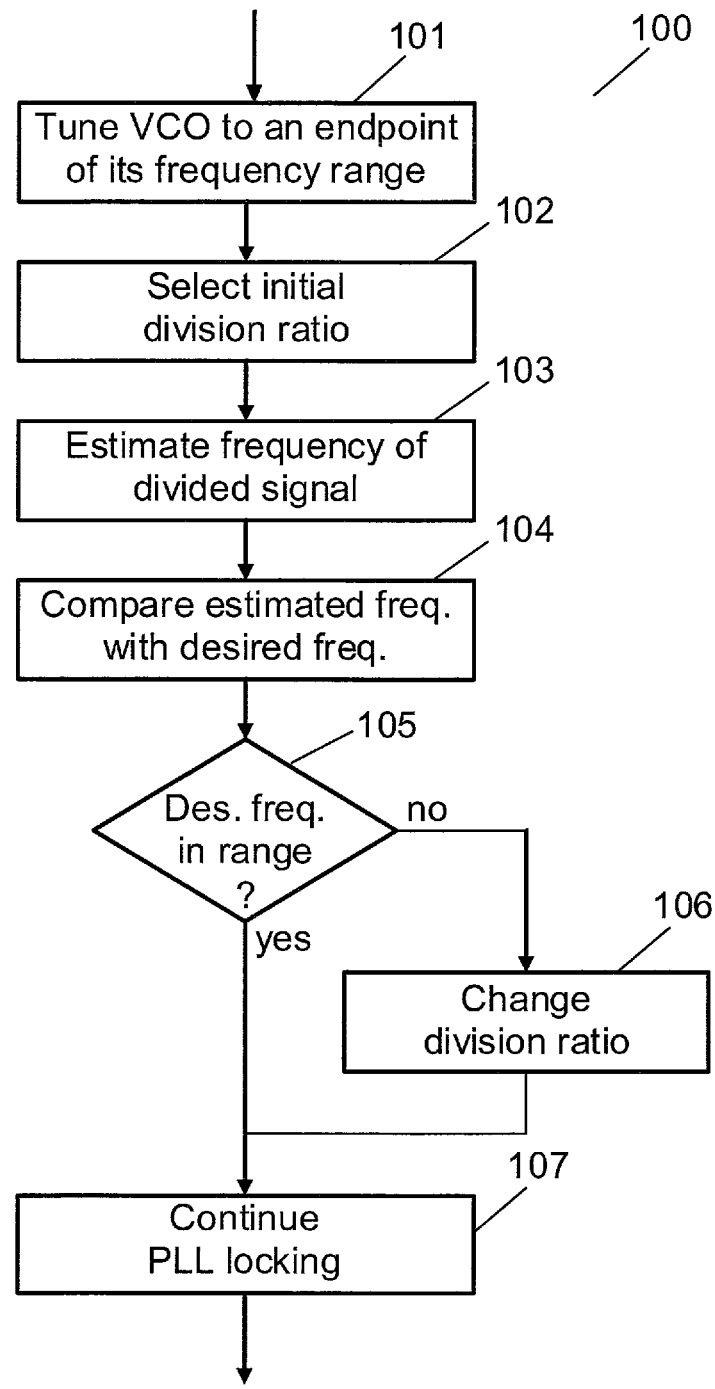
FIG. 11 shows a flowchart of a divider choice algorithm for the arrangement of FIG. 10.

This algorithm is illustrated in the flowchart 100 of FIG. 11. In step 101 the VCO is tuned to either the upper or the lower endpoint of its frequency range, and an initial division ratio is selected in step 102. If the upper endpoint was selected, the ratio 2 is selected, while the ratio 1 (i.e. using the VCO signal unchanged) is selected in case of the lower endpoint. The actual frequency (which could vary due to PVT spread and design mistakes/modeling errors) of the resulting signal is then estimated in step 103 and compared with the desired frequency in steps 104 and 105. If the desired frequency is in the range of the resulting divided signal, i.e. lower than the estimated frequency in case the upper endpoint was chosen and higher than the estimated frequency in case the lower endpoint was chosen, the locking of the phase locked loop is continued in step 107. Otherwise, the division ratio is changed in step 106 before the locking of the phase locked loop is continued in step 107.

Figure 12:
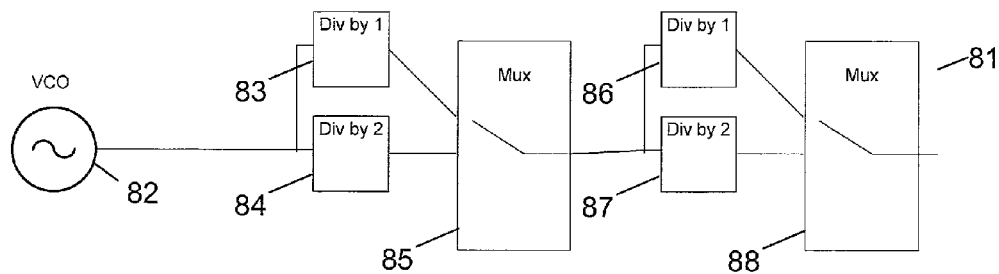
FIG. 12 shows a combination of the setup of FIG. 5 and the arrangement of FIG. 8.

This method can also be used together with the circuit of FIG. 5, where a frequency divider is used to extend the relative frequency range ($f_{max}/f_{min}$) of a VCO from a factor 2 to a factor 4. In principle, the dividers and the multiplexer of FIG. 8 can just be added to the circuit of FIG. 5, as it is shown in the circuit 81 in FIG. 12. The first two dividers 83 and 84 and the multiplexer 85 together with the VCO 82 provide a VCO unit with a relative frequency range of 4 times centered higher than the desired output range, and similarly to FIGS. 8 and 10 the two further dividers 86 and 87 and the multiplexer 88 automatically divides the output signal by 1 or 2 depending on the desired output frequency and the actual VCO centering.

Figure 13:
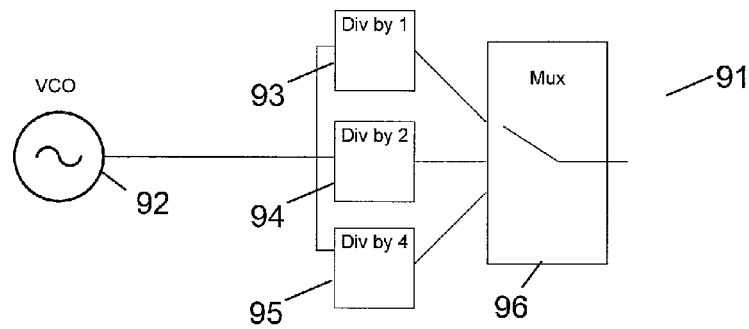
FIG. 13 shows a VCO arrangement in which the VCO output signal, which is centered higher than the desired frequency range, is selectively divided by 1, 2 or 4.

The same result can be achieved by adding a divide-by-4 block to the circuit of FIG. 8, as it is shown in FIG. 13.

As in FIG. 8, the VCO 92 in this figure can be a single VCO covering one octave, or it can represent e.g. the VCO unit of FIG. 4. If the desired frequency range is 1 to 4 GHz as in FIG. 5, this could be obtained by using a VCO with a frequency range of 2 to 4 GHz centered at 2.83 GHz and dividing the output signal by 1 or 2, in which case there would be no margin if the VCO drifts downwards, or it could be obtained by using a VCO with a frequency range of 4 to 8 GHz centered at 5.66 GHz and dividing the output signal by 2 or 4, in which case there would be no margin if the VCO drifts upwards.

Similarly to above, the desired frequency range can also be obtained by using a VCO with a frequency range centered anywhere between the two center values mentioned above and then dividing the output signal by 2 or 4 in the dividers 94 or 95 to obtain the lower values in the desired range and dividing the output signal by 1 or 2 in the dividers 93 or 94 to obtain the higher values in the desired range, which will allow margins for VCO drift. The multiplexer 96 then selects the appropriate one of the divided signals. Since also this solution can handle VCO output signals in the range from 2 to 8 GHz, a good solution is obtained if the VCO is centered on the geometric mean of these 2 frequencies, i.e. sqrt(2*8)=4 GHz.

Figure 14:
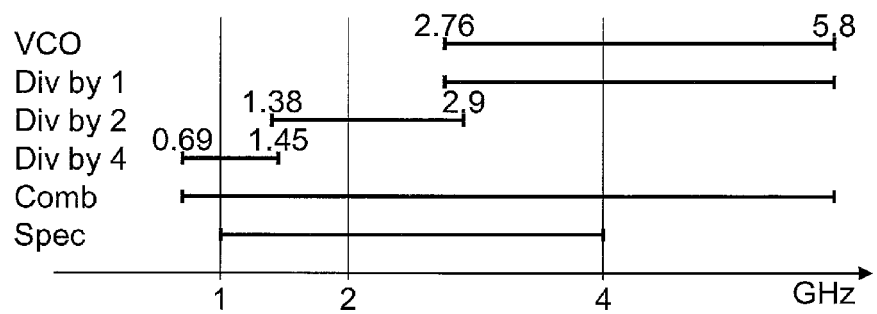
FIG. 14 illustrates an example of the frequency ranges for the arrangement of FIG. 13.

Again there will be large margins allowing drift of the actual VCO frequency upwards as well as downwards, and thus the VCO needs no longer cover the ~12% margins at each end of the tuning range mentioned above. However, as above a small margin of 2.5% in each end will still be required to cover temperature drift and reduced tuning range due to process spread resulting in a VCO tuning range of 2.1, which is a significant reduction compared to the previous required tuning range of 2.5. Similarly to above, the VCO should have a nominal frequency range of 0.975*4/sqrt(2) to 1.025*4*sqrt(2), i.e. 2.76 to 5.8 GHz. This is illustrated in FIG. 14, where it is seen that the divide-by-1 signal, which equals the VCO signal, nominally covers the frequency range from 2.76 to 5.8 GHz, while the divide-by-2 signal then covers the frequency range from 1.38 to 2.9 GHz and the divide-by-4 signal covers the frequency range from 0.69 to 1.45 GHz, so that the combined covered frequency range is 0.69 to 5.8 GHz.

Thus with this centering, we can allow a huge VCO spread (−28%→+38%) and still produce the correct output frequencies in the desired frequency range from 1 to 4 GHz (Spec) by choosing the correct divider. If the desired output frequency is in the range from 1 to 2 GHz, we should divide by 2 or 4, and if the output frequency is in the range from 2 to 4 GHz, we should use division ratio 1 or 2.

Figure 15:
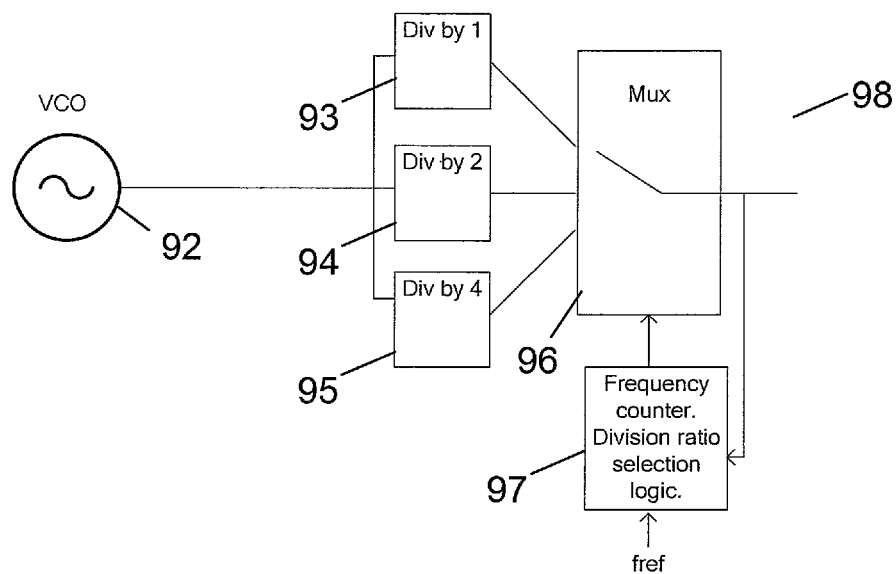
FIG. 15 shows the arrangement of FIG. 13 with a frequency counter added.

The choice of VCO division ratio should be made prior to locking the phase locked loop. It should be made every time the phase locked loop is locked to take changing operating conditions into account. There are several ways to do this selection. One way would be to use a frequency counter. The reference frequency for this counter would be the reference frequency of the phase locked loop. To get a frequency accuracy of 0.1%, we need to count 500 pulses. Assuming we count at ~500 MHz (VCO/4), this would take 1 us. This time is very small compared to the normal PLL locking time, which is ~100 us. FIG. 15 depicts a VCO system 98 with a frequency counter 97. The rest of the system corresponds to that of FIG. 13.

A divider choice algorithm could then look like this:
1. Tune the VCO to the highest frequency (corresponding to the nominal highest frequency 5.8 GHz in FIG. 14; the actual frequency may deviate slightly from this value due to drift and tolerances).
2. Select initial division ratio. If the desired output frequency is 1-2 GHz, select 4 (resulting in a nominal frequency of 1.45 GHz), otherwise select 2 (resulting in a nominal frequency of 2.9 GHz).
3. Estimate the frequency using the frequency counter.
4. If the estimated frequency is higher than the desired one, continue normal PLL locking. Otherwise, half the division ratio and continue normal PLL locking.

Also here the VCO could just as well be tuned to the lowest frequency.

It is noted that in the prior art of FIG. 5 the frequency divider 67 (divide-by-2) is used to extend the relative frequency range from a factor 2, which is the frequency range of the VCO, to a factor 4. The relative frequency range can be extended further by adding further dividers, e.g. divide-by-4, divide-by-8, etc., i.e. using further division ratios that are integer powers of the number 2. Similarly, the frequency range of the circuit of FIG. 13 or 15 can be extended by adding further dividers. However, such additional dividers are not directly related to the invention. The idea of the invention is (independently of the number of dividers used to extend the relative range) to use one additional divider and center the VCO higher than otherwise required, i.e. such that the VCO covers the upper part of the desired frequency range and some frequencies above this range. This allows a sufficient margin below as well as above the desired range for e.g. drift and tolerances of the VCO.

Although various embodiments of the present invention have been described and shown, the invention is not restricted thereto, but may also be embodied in other ways within the scope of the subject-matter defined in the following claims.

The invention claimed is:
1. A method of generating a first oscillator signal having a desired frequency in a first continuous frequency range, the method comprising:
   generating in a voltage controlled oscillator unit with at least one voltage controlled oscillator a second oscillator signal having a frequency in a combined second continuous frequency range of at least one octave;
   selecting said second continuous frequency range to have a lower endpoint in said first frequency range and an upper endpoint above said first frequency range;
   selectively using said second oscillator signal unchanged or dividing said second oscillator signal by a division ratio selected from a group of division ratios comprising integer powers of the number 2 to obtain said first oscillator signal;
   comparing the actual frequency of said first oscillator signal with said desired frequency; and
   selecting said division ratio in dependence of the result of the comparison, wherein the step of selecting said division ratio comprises:
   tuning the voltage controlled oscillator unit to a frequency at an endpoint of said second continuous frequency range;
   selecting an initial division ratio from said group of division ratios so that the frequency of said first oscillator signal is within said first frequency range; and
   adjusting, if possible, the frequency of the voltage controlled oscillator unit so that the frequency of said first oscillator signal equals said desired frequency, and otherwise changing the division ratio and adjusting the frequency of the voltage controlled oscillator unit so that the frequency of said first oscillator signal equals said desired frequency.

2. A method according to claim 1, wherein said second continuous frequency range is selected so that its upper endpoint is $\sqrt{2}$ times the upper endpoint of said first frequency range.

3. A method according to claim 1, wherein the group of division ratios comprises the ratios 2 and 4.

4. A voltage controlled oscillator arrangement for generating a first oscillator signal having a desired frequency in a first continuous frequency range, the arrangement comprising:
   a voltage controlled oscillator unit with at least one voltage controlled oscillator, the unit being configured to generate a second oscillator signal having a frequency in a combined second continuous frequency range of at least one octave;
wherein said second continuous frequency range has been selected to have a lower endpoint in said first frequency range and an upper endpoint above said first frequency range; and the arrangement further comprises:
   means for selectively using said second oscillator signal unchanged or dividing said second oscillator signal by a division ratio selected from a group of division ratios comprising integer powers of the number 2 to obtain said first oscillator signal;
   means for comparing the actual frequency of said first oscillator signal with said desired frequency; and
   means for selecting said division ratio in dependence of the result of the comparison, wherein the means for selecting said division ratio is configured to:
   tune the voltage controlled oscillator unit to a frequency at an endpoint of said second continuous frequency range;
   select an initial division ratio from said group of division ratios so that the frequency of said first oscillator signal is within said first frequency range; and adjust, if possible, the frequency of the voltage controlled oscillator unit so that the frequency of said first oscillator signal equals said desired frequency, and otherwise change the division ratio and adjust the frequency of the voltage controlled oscillator unit so that the frequency of said first oscillator signal equals said desired frequency.

5. A voltage controlled oscillator arrangement according to claim 4, wherein said second continuous frequency range has been selected so that its upper endpoint is $\sqrt{2}$ times the upper endpoint of said first frequency range.

6. A voltage controlled oscillator arrangement according to claim 4, wherein the group of division ratios comprises the ratios 2 and 4.

\* \* \* \* \*

UNITED STATES PATENT AND TRADEMARK OFFICE
CERTIFICATE OF CORRECTION

PATENT NO. : 8,779,863 B2  
APPLICATION NO. : 13/508414  
DATED : July 15, 2014  
INVENTOR(S) : Nilsson Page 1 of 1

It is certified that error appears in the above-identified patent and that said Letters Patent is hereby corrected as shown below:

In the specification

In Column 6, Line 66, delete "divider)" and insert -- divided --, therefor.

Signed and Sealed this  
Fifteenth Day of March, 2016

Michelle K. Lee  
*Director of the United States Patent and Trademark Office*